United States Patent [19]
Burkhart

[11] Patent Number: 5,825,607
[45] Date of Patent: Oct. 20, 1998

[54] INSULATED WAFER SPACING MASK FOR A SUBSTRATE SUPPORT CHUCK AND METHOD OF FABRICATING SAME

[75] Inventor: Vincent E. Burkhart, San Jose, Calif.

[73] Assignee: Applied Materials, Inc., Santa Clara, Calif.

[21] Appl. No.: 639,843

[22] Filed: May 8, 1996

[51] Int. Cl.$^6$ ................................................. H02N 13/00
[52] U.S. Cl. ............................................................ 361/234
[58] Field of Search ................................. 361/230, 233, 361/234; 279/128; 269/8, 903

[56] References Cited

U.S. PATENT DOCUMENTS

| | | | |
|---|---|---|---|
| 4,480,284 | 10/1984 | Tojo et al. ................................. | 361/234 |
| 4,502,094 | 2/1985 | Lewin et al. ............................... | 361/234 |
| 4,551,192 | 11/1985 | Di Milia et al. ........................... | 156/345 |
| 4,554,611 | 11/1985 | Lewin ........................................ | 361/234 |
| 4,665,463 | 5/1987 | Ward et al. ................................ | 361/234 |
| 5,001,594 | 3/1991 | Bobbio ...................................... | 361/234 |
| 5,656,093 | 8/1997 | Burkhart et al. .......................... | 279/128 |

FOREIGN PATENT DOCUMENTS

| | | | |
|---|---|---|---|
| 0 452 222 A1 | 10/1991 | European Pat. Off. ........ | H01L 21/00 |
| 60-261377 | 12/1985 | Japan .............................. | H02N 13/00 |
| 63-194345 | 8/1988 | Japan .............................. | H01L 21/68 |
| 64-18236 | 1/1989 | Japan .............................. | H01L 21/68 |

*Primary Examiner*—Fritz Fleming
*Attorney, Agent, or Firm*—Thomason & Moser

[57] ABSTRACT

An insulated wafer spacing mask for supporting a workpiece in a spaced apart relation to a workpiece support chuck. More specifically, the wafer spacing mask contains a plurality of support members deposited upon an insulating material located between the wafer spacing mask and the support surface of the chuck. The support members maintain a wafer, or other workpiece, in a spaced apart relation to the support surface of the chuck. The distance between the underside surface of the wafer and the chuck is defined by the thickness of the support members. This distance should be larger than the expected diameter of contaminant particles that may lie on the surface of the chuck. In this manner, the contaminant particles do not adhere to the underside of the wafer and current leakage through the wafer is minimized.

23 Claims, 2 Drawing Sheets

INSULATED WAFER SPACING MASK FOR A SUBSTRATE SUPPORT CHUCK AND METHOD OF FABRICATING SAME

BACKGROUND OF THE DISCLOSURE

1. Field of the Invention

The invention relates to an apparatus and method for a substrate support chuck for supporting a semiconductor wafer within a semiconductor processing system. More particularly, the invention relates to an insulated wafer spacing device deposited upon the surface of a substrate support chuck for supporting a semiconductor wafer such that the surface of the wafer that faces the chuck is spaced-apart and substantially parallel to the surface of the chuck.

2. Description of the Background Art

Substrate support chucks are widely used to support substrates within semiconductor processing systems. A particular type of chuck used in high-temperature semiconductor processing systems such as high-temperature physical vapor deposition (PVD) is a ceramic electrostatic chuck. These chucks are used to retain semiconductor wafers, or other workpieces, in a stationary position during processing. Such electrostatic chucks contain one or more electrodes imbedded within a ceramic chuck body. The ceramic material is typically aluminum-nitride or alumina doped with a metal oxide such as titanium oxide ($TiO_2$) or some other ceramic material with similar resistive properties. This form of ceramic is partially conductive at high temperatures.

In use, a wafer rests flush against the surface of the chuck body as a chucking voltage is applied to the electrodes. Because of the conductive nature of the ceramic material at high temperatures, the wafer is primarily retained against the ceramic support by the Johnsen-Rahbek effect. Such a chuck is disclosed in U.S. Pat. No. 5,117,121 issued May 26, 1992.

One disadvantage of using a chuck body fabricated from ceramic is that, during manufacture of the support, the ceramic material is "lapped" to produce a relatively smooth surface. Such lapping produces particles that adhere to the surface of the support. These particles are very difficult to completely remove from the surface. Additionally, the lapping process may fracture the surface of the chuck body. Consequently, as the chuck is used, particles are continuously produced by these fractures. Also, during wafer processing, the ceramic material can abrade the wafer oxide from the underside of the wafer resulting in further introduction of particulate contaminants to the process environment. During use of the chuck, the particles can adhere themselves to the underside of the wafer and be carried to other process chambers or cause defects in the circuitry fabricated upon the wafer. It has been found that tens of thousands of contaminant particles may be found on the backside of a given wafer after retention upon a ceramic electrostatic chuck.

Japanese patent application No. 60-261377, published Dec. 24, 1985, discloses a ceramic electrostatic chuck having an embossed support surface. The embossing reduces the surface area of the ceramic support that contacts the wafer. Consequently, the number of contaminant particles transferred to the wafer is reduced. However, such an embossed surface maintains some degree of contact between the ceramic material and the underside of the wafer. Thus, contamination, though reduced, is still substantial.

Similarly, substrate support chucks that are used in low-temperature processing (e.g., less than 300 degrees Celsius) may also produce contaminant particles that interfere with the wafer processing. Such low-temperature chucks include electrostatic chucks and mechanical clamping chucks which contain wafer support surfaces that are typically fabricated from dielectric materials such as alumina. These types of chucks have also been found to produce particular contaminants during use that can adhere to the underside of the wafer during processing.

One disadvantage of using a chuck body fabricated from ceramic or a non-ideal dielectric is "current leakage." When high temperatures are used during semiconductor processing, current may flow through the wafer and chuck body to the electrodes. If the current is large enough, the wafer can be damaged.

Therefore, a need exists in the art for an apparatus that reduces the amount of contaminant particles that adhere to the underside of the wafer while reducing current leakage through the wafer supported upon an electrostatic chuck.

SUMMARY OF THE INVENTION

The disadvantages of the prior art are overcome by the present invention of a wafer spacing mask for supporting a wafer, or other workpiece, in a spaced-apart relation to a chuck. More specifically, the invention is a wafer spacing mask containing a plurality of support members deposited upon regions of insulating material located on the support surface of a chuck. Such insulating regions reduce current leakage at high process temperatures.

The spacing mask is fabricated from a material that is different from the material of the chuck surface. The material of the wafer spacing mask has superior contact properties as compared to the chuck surface material including being less abrasive and more compliant. Such wafer spacing mask fabrication materials include metals such as titanium, titanium-nitride, stainless-steel and the like.

The insulating regions upon which the plurality of support members are deposited are fabricated from a material that is also different from the material of the chuck surface. The insulating material has superior insulating properties at high temperatures (e.g., 300° C. degrees or more) than that of the material of the chuck surface. Such insulating materials include boron-nitride, aluminum-oxide, diamond and the like.

The support members maintain a wafer, or other workpiece, in a spaced apart relation relative to the support surface of the chuck. The distance between the underside surface of the wafer and the chuck is defined by the thickness of the support members. This distance should be larger than the expected diameter of contaminant particles that may lie on the surface of the chuck. In this manner, the contaminant particles do not adhere to the underside of the wafer during processing. Also, the surface of the support members that do contact the wafer are easily cleaned so that most particles are removed from these surfaces and are trapped in the spaces between the support members.

In a specific embodiment of the invention, insulating regions are fabricated by depositing, for example, using a physical vapor deposition (PVD) process, insulating pads on the support surface of a ceramic chuck. Atop the insulating pads are deposited, also using a PVD process, metallic support members of the spacing mask. The spacing mask and insulating regions may also be deposited using chemical vapor deposition (CVD), plasma spray deposition, brazing, flame spray deposition, and the like. The insulating regions and support members are deposited in a pre-defined pattern such as a plurality of spaced-apart pads, radial strips, concentric rings, or a combination of radial strips and concentric rings.

In an alternative embodiment of the invention, the insulating regions are formed in a predefined pattern by cutting or drilling indentations (e.g., bores or trenches) into the surface of the chuck body. These indentations are then filled with an insulating material such as boron-nitride. The insulating material is cured, for example, by sintering the chuck body to harden the material. Lastly, the cured insulating material is lapped to produce insulating regions that each have an exposed surface that is flush with the support surface of the chuck body. The wafer spacing mask is deposited, as mentioned above, in a pattern that matches the pattern of the insulating regions.

As a result of using either embodiment of the invention during processing of semiconductor wafers, the level of current leakage has been reduced from a milliamp range to a microamp range. Also as a result of using the invention during processing of semiconductor wafers, the number of particulate contaminants adhered to the underside of a wafer after processing has been reduced from tens of thousands of particles to hundreds of particles. These substantial improvements in current leakage and particle count has significantly decreased the number of wafers that are found defective during processing. Such improvement has been accomplished without substantial degradation to the wafer clamping force that retains the wafer upon the chuck.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
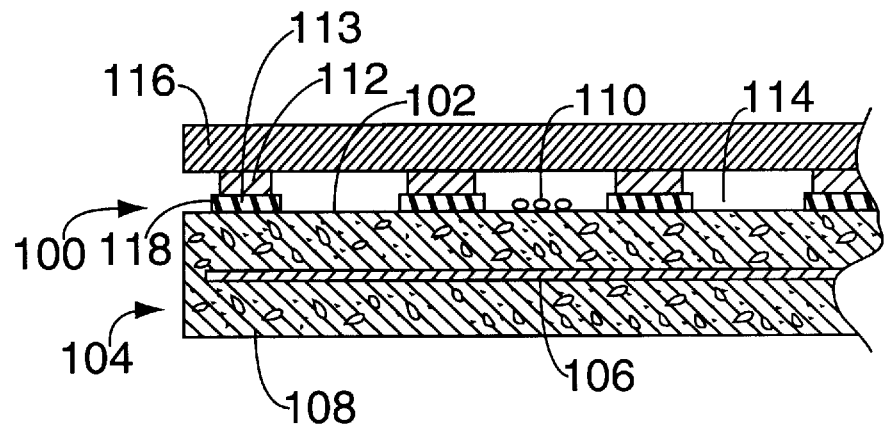
FIG. 1 depicts a vertical cross-sectional view of a ceramic electrostatic chuck containing the insulated wafer spacing mask of the present invention.
Figure 3:
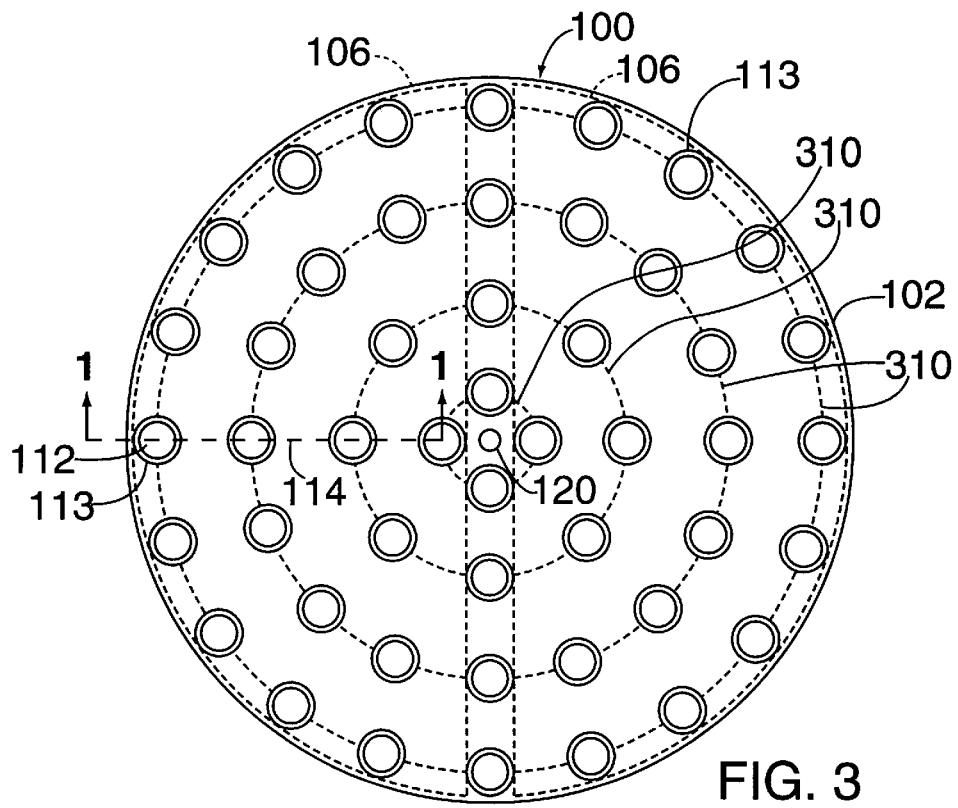
FIG. 3 depicts a top plan view of a pattern for the wafer spacing mask.

FIG. 1 depicts vertical cross-sectional view of a wafer spacing mask 100 positioned in relation to the support surface 102 of a ceramic electrostatic chuck 104. To illustrate the use of the invention, FIG. 1 depicts the spacing mask 100 supporting a semiconductor wafer 116. FIG. 3 depicts a top plan view of the wafer spacing mask 100 of FIG. 1 (without the wafer 116). For best understanding of the invention, the reader should refer to both FIGS. 1 and 3 while reading the following disclosure.

Although the preferred embodiment of the present invention is discussed as used in conjunction with a ceramic electrostatic chuck, the invention is also useful in supporting substrates above any form of chuck including non-ceramic electrostatic chucks, mechanical clamping chucks, and the like. One important feature of the invention is that the spacing mask be fabricated from a material such as metal that has contact properties that are different from the chuck material such that the material of the chuck surface does not contact the underside of the wafer.

In the preferred embodiment, the electrostatic chuck 104 contains one or more electrodes 106 imbedded within a ceramic chuck body 108. The electrode structure could be any type positioned anywhere in the range of 150 to 350 μm from the support surface 102 of the chuck body 104. Typical electrode structures include a pair of coplanar D-shaped electrodes, coplanar interdigital electrodes, or a single circular electrode. FIG. 3 illustratively depicts a pair of coplanar D-shaped electrodes 106 (dashed lines).

The ceramic chuck body is, for example, fabricated of aluminum-nitride or doped boron-nitride. Such a partially conductive ceramic material promotes the Johnsen-Rahbek effect during high temperature processing. Other partially conductive ceramics also form useful high temperature chuck materials such as alumina doped with a titanium oxide or a chromium oxide. If the chuck is to be used at low temperatures only, then other ceramic and/or dielectric materials such as alumina are used to form the chuck body. An illustrative ceramic electrostatic chuck is disclosed in commonly assigned U.S. Pat. No. 5,117,121 issued May 26, 1992, herein incorporated by reference. Examples of non-ceramic electrostatic chucks are disclosed in U.S. Pat. No. 4,184,188 issued Jan. 15, 1980 and U.S. Pat. No. 4,384,918 issued May 24, 1983, both of which are incorporated herein by reference.

The insulating material 113 used between the mask 100 and chuck surface 102 is a material that is different from the material of the chuck surface. Specifically, the insulating material has superior insulating properties at high temperatures (e.g., 300° C. degrees or more) compared to the material comprising the chuck surface. Also, the insulating material is a material that bonds and is thermally compatible with the surrounding ceramic chuck material. Such insulating materials include boron-nitride, diamond, oxides, such as aluminum-oxide, and the like.

The insulating material 113 is deposited in predefined regions on the support surface of the chuck. The dimensions of the deposits 118 onto the ceramic chuck depend upon the dimensions of each support member 112 of the spacing mask 100 because each deposit on the chuck surface is aligned with each spacing mask support member 112. The diameter of each insulating region should be slightly larger (e.g., by approximately 0.25 cm (0.1 inch)) than the diameter of a corresponding pad 112. An illustrative thickness of each insulating region is approximately 1 micron.

The insulating material is typically deposited using a PVD process. Specifically a patterned titanium template is applied to the chuck surface, then a 1 micron deposit of insulating material is deposited. Following this deposition, the spacing mask material is deposited in two successive 1 micron layers. The template is then removed from the chuck surface. The result is a pattern of insulating material and mask material atop the chuck surface.

Figure 2:
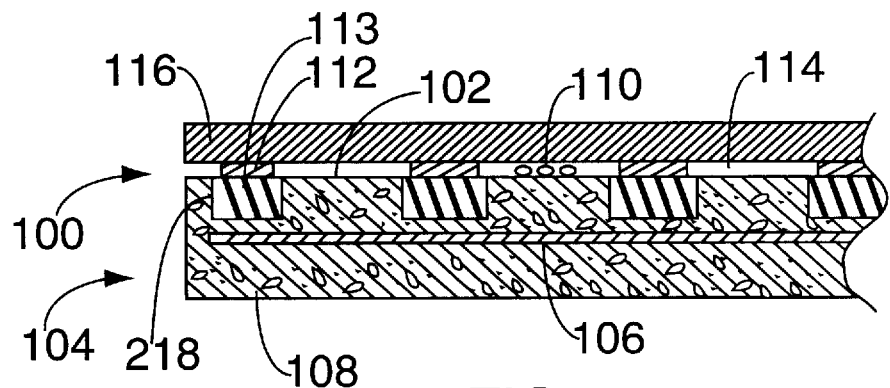
FIG. 2 depicts a vertical cross-sectional view of an electrostatic chuck containing an alternative embodiment of the insulated wafer spacing mask of the present invention.

FIG. 2 depicts a vertical cross-sectional view of an alternative embodiment of the invention. In this embodiment, the insulating regions are imbedded in the surface of the chuck body rather than deposited atop the surface as discussed above. Specifically, to form the imbedded regions, indentations 218, such as "spot faced" bores or trenches, are cut into the surface of the ceramic chuck. These indentations are filled with insulating material 113 to form insulating regions having a pre-defined pattern matching the pre-defined pattern of the spacing mask. Specifically, spot facing the surface of the ceramic chuck entails drilling a plurality of indentations on the surface of the ceramic chuck to a specified depth. The dimensions of the indentations drilled into the ceramic chuck depend upon the dimensions of each spacing mask pad 112 because each indentation on the ceramic chuck is concentrically aligned with each spacing mask pad 112. The diameter of each indentation 218 should be slightly larger (e.g., by approximately 0.25 cm (0.1 inch)) than the diameter of a corresponding pad 112. The depth of the indentations is not critical. They may even be bored through the electrode 106. A layer of insulating material is applied to the surface of the ceramic chuck to completely fill each indentation. The insulating material is then cured by sintering the chuck body. The insulating material is then lapped to expose the support surface 102 of the ceramic chuck body 108. As a result, the insulating material 118 is flush with the support surface of the chuck body.

The wafer spacing mask 100 is deposited upon the insulating regions on the support surface of the chuck body typically using a physical vapor deposition (PVD) process. The material may also be deposited by chemical vapor deposition (CVD), plasma spray deposition brazing, flame spray deposition, and the like. The material of the wafer spacing mask has superior contact properties as compared to the surface material of the chuck. For example, the mask material is less abrasive and more compliant (e.g., produces less particles) than the surface material of the chuck. Typically, the material used to form the mask is a metal such as titanium, titanium nitride, stainless steel and the like. Other materials, including conductors, insulators and semiconductors, that have superior contact properties can also be used to fabricate the spacing mask 100.

The spacing mask material is deposited to a pre-defined thickness that maintains the wafer 116, or other workpiece, above the support surface such that particles 110 on the support surface do not contact the wafer surface. An illustrative thickness is approximately 2 microns. The metallic support members are easily cleaned to ensure that any surfaces that contact the wafer 116 are substantially free of contaminants. Importantly, the contaminants tend to become trapped in the spaces 114 between the support members 112.

FIG. 3 depicts an illustrative mask pattern having the support members formed as a plurality of spaced-apart pads 112—112 of deposited material. Each pad 112 has a diameter of approximately 0.25 cm (0.1 inches). As stated above, the diameter of each region of insulating material 113 located on, or imbedded in, the ceramic surface 102 should be slightly larger (e.g., by approximately 0.25 cm (0.1 inch)) than the diameter of a corresponding pad 112. The insulating regions 113 and their associated pads 112 are arranged in concentric rings (shown as dashed lines 310), that are spaced apart by 0.64 cm (0.25 inches). Generally speaking, the number, spacing and size of the pads is determined by the amount of clamping force applied by the electrostatic chuck. For example, if the amount of force is large and the pads are spaced relatively distant from one another, the wafer may bow between the pads. On the other hand, placing too many pads on the surface of the chuck could interfere with the electrostatic fields that facilitate the clamping force. Therefore, the pads must be judiciously positioned to optimize support yet limit their interference with the clamping force.

Since the ceramic chuck 104 becomes semiconducting at high temperatures (e.g., 300° C. degrees or more), free charge within the ceramic material migrates to the support surface 102 of the chuck body 108 to produce the Johnsen-Rahbek effect, i.e., charges similarly migrate through the wafer 116 to its underside surface and the attractive force between the spaced apart charges produces the clamping forces. By inserting the insulating material between the mask and chuck body, damage to the wafer by current leakage is minimized while maintaining a strong Johnsen-Rahbek effect.

On the other hand, at low temperatures (e.g., less than 300° C. degrees) the ceramic chuck 104 conducts less current and, for these applications of the invention and for applications of the spacing mask on dielectric chucks or mechanical clamping chucks, the invention continues to prevent damage due to particle contamination and current leakage through non-ideal dielectrics. To ensure adequate and uniform support of the wafer above the chuck, the support members should be evenly distributed over the entire surface of the chuck that, absent the spacing mask, would contact the underside of the wafer.

To facilitate heat transfer from the wafer to the chuck body 108, a heat transfer medium, e.g., a gas such as helium, is pumped into the space 114 between the backside surface of the wafer 116 and the support surface 102 of the chuck body 108. This cooling technique is known as "backside cooling". The heat transfer medium is provided via a port 120 that is formed through the chuck body 108. The medium is typically supplied to the underside of the wafer at a rate of 2–30 sccm. Such backside cooling is well-known in the art and is disclosed, for example, in commonly assigned U.S. Pat. No. 5,228,501, issued to Tepman et al. on Jul. 20, 1993. Importantly, when backside cooling is used, the wafer spacing mask pattern has a dual purpose: (1) to support the wafer to reduce backside particle adherence and (2) to create heat transfer medium distribution channels upon the support surface of the chuck. However, additional heat transfer medium distribution channels (not shown) may be formed in the surface of the chuck body to further aid distribution of the heat transfer medium across the underside of the wafer.

Figure 4:
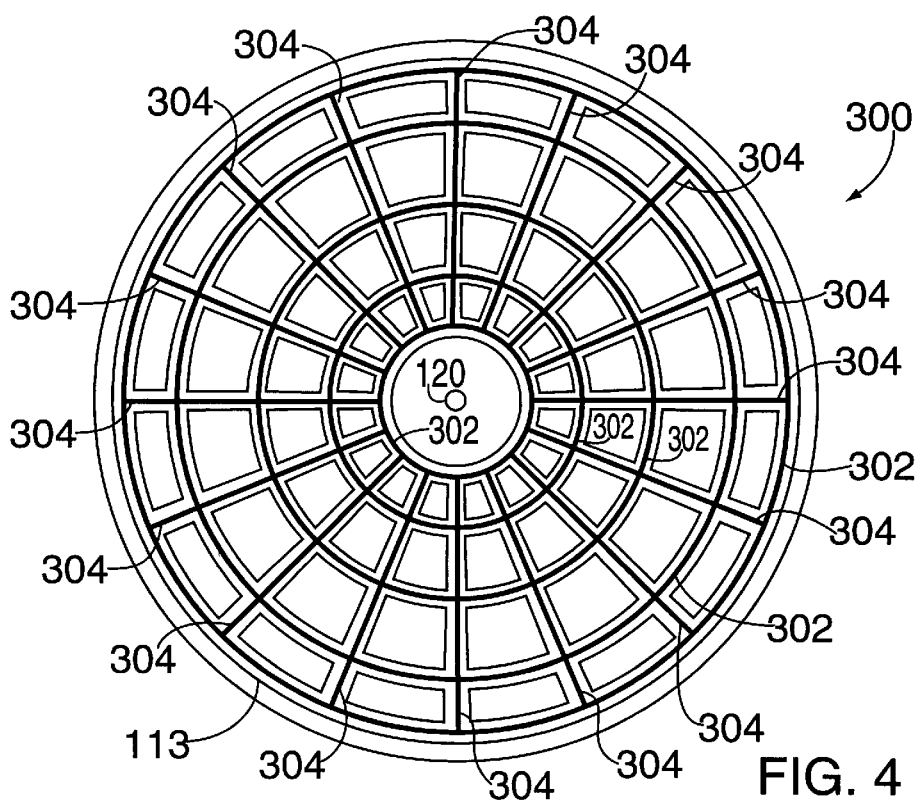
FIG. 4 depicts top plan view of an alternative pattern for the wafer spacing mask.

FIG. 4 depicts an alternative mask layout 300 where the mask contains a plurality of concentric rings 302 as well as radially extending strips 304 that interconnect the rings. The rings, for example, are spaced from one another by approximately 0.64 cm (0.25 inches). For this layout, the insulating material would be inserted between the support surface of the chuck and the mask in a plurality of deposits or regions in the same pattern on, or imbedded in, the support surface as that of the mask layout. Alternatively, the rings or the radial strips could be used separately as the spacing mask. The material for this embodiment of the mask is also deposited using a PVD process or some other deposition technique appropriate for depositing the mask material in a particular pattern.

Other mask patterns may be used. The key feature of the invention is that a spacing mask supports the wafer in a spaced-apart relation to the surface of the chuck. Furthermore, the mask is deposited on insulating material on, or imbedded in, the support surface of the ceramic chuck. The particular mask pattern, the design of deposits or regions of the insulating material, and the mask material is defined by the particular application for the chuck including such factors as chucking voltage, chucking force, wafer thickness, the chuck electrode pattern, the particular process that the wafer is to be subjected and the like.

Using the spacing mask with an insulating material in conjunction with a ceramic chuck has resulted in substantially decreased particulate contamination of wafers and in substantially decreased current leakage through the wafer. Empirical data shows that a conventional ceramic chuck supporting a wafer directly upon its support surface can transfer tens of thousands of particles to the underside of a wafer and produce milliamps of current leakage through the wafer. However, using the inventive spacing mask, in combination with the insertion of an insulating material beneath the mask, reduces the particle count for particles located on the underside of a wafer to hundreds of particles and reduces current leakage through the wafer to micro amperage value. Importantly, the spacing mask does not significantly interfere with the clamping process or impact the clamping force that retains the wafer upon the chuck.

Although various embodiments which incorporate the teachings of the present invention have been shown and described in detail herein, those skilled in the art can readily devise many other varied embodiments that still incorporate these teachings.

What is claimed is:

1. Apparatus for supporting a workpiece in a spaced-apart relation to a support surface of a workpiece support chuck, comprising:
   a plurality of individual insulating regions deposited on said support surface of said workpiece support chuck; and
   a spacing mask, deposited upon said insulating regions, for supporting said workpiece in a spaced-apart relation to said support surface.

2. The apparatus of claim 1 wherein said spacing mask is fabricated of a metallic material.

3. The apparatus of claim 2 wherein said metallic material is a titanium, titanium-nitride or stainless steel.

4. The apparatus of claim 1 wherein said insulating regions comprise a predefined pattern of insulating regions imbedded within said support surface.

5. The apparatus of claim 4 wherein said spacing mask comprises individual support members forming a pattern, where said support member pattern is substantially similar to said predefined pattern of said insulating regions.

6. The apparatus of claim 5 wherein said support member pattern comprises a plurality of pads.

7. The apparatus of claim 1 wherein said insulating regions comprise a predefined pattern of insulating regions deposited atop said support surface.

8. The apparatus of claim 5 wherein said spacing mask comprises individual support members forming a pattern, where said support member pattern is substantially similar to said predefined pattern of said insulating regions.

9. The apparatus of claim 8 wherein said support member pattern comprises a plurality of pads.

10. Apparatus for supporting a workpiece in a spaced-apart relation to a support surface of a ceramic electrostatic chuck, comprising:
    a predefined pattern of insulating regions located atop said support surface; and
    a spacing mask, deposited upon said insulating regions, for supporting said workpiece in a spaced-apart relation to said support surface.

11. The apparatus of claim 10 wherein said spacing mask is fabricated of a metallic material.

12. The apparatus of claim 11 wherein said metallic material is a titanium, titanium-nitride or stainless steel.

13. The apparatus of claim 10 wherein said spacing mask comprises support members forming a pattern, where said support member pattern is substantially similar to said pattern of said insulating regions.

14. The apparatus of claim 13 wherein said support member pattern comprises a plurality of pads.

15. Apparatus for supporting a workpiece in a spaced-apart relation to a support surface of a ceramic electrostatic chuck, comprising:
    a predefined pattern of insulating regions imbedded within said support surface; and
    a spacing mask, deposited upon said insulating regions for supporting said workpiece in a spaced-apart relation to said support surface.

16. The apparatus of claim 15 wherein said spacing mask is fabricated of a metallic material.

17. The apparatus of claim 16 wherein said metallic material is a titanium, titanium-nitride or stainless steel.

18. The apparatus of claim 15 wherein said spacing mask comprises support members forming a pattern, where said support member pattern is substantially similar to said pattern of said insulating regions.

19. The apparatus of claim 18 wherein said support member pattern comprises a plurality of pads.

20. A method of fabricating an insulated wafer spacing mask comprising the steps of:
    providing a workpiece support chuck having a support surface;
    forming a pattern of individual insulating regions on said support surface; and
    depositing individual support members of a wafer spacing mask upon said individual insulating regions.

21. The method of claim 20 wherein said forming step further comprises:
    creating, in a predefined pattern, indentations into said support surface;
    filling said indentations with insulating material to form said insulating regions;
    sintering said workpiece support chuck; and
    lapping said insulating regions until a surface of said insulating regions is flush with said support surface.

22. The method of claim 20 wherein said depositing step further comprises the step of using a physical vapor deposition process to deposit the wafer spacing mask.

23. The method of claim 20 wherein said forming step further comprises the step of using a physical vapor deposition process to deposit an insulating material to form the insulating regions.

* * * * *